United States Patent
Betz et al.

(10) Patent No.: US 7,732,333 B2
(45) Date of Patent: Jun. 8, 2010

(54) PROCESS FOR PRODUCING AND APPARATUS FOR IMPROVING THE BONDING BETWEEN A PLASTIC AND A METAL

(75) Inventors: Bernd Betz, Obertraubling/Oberhinkofen (DE); Jochen Dangelmaier, Beratzhausen (DE); Stefan Paulus, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 271 days.

(21) Appl. No.: 10/575,798

(22) PCT Filed: Oct. 1, 2004

(86) PCT No.: PCT/DE2004/002199

§ 371 (c)(1),
(2), (4) Date: Jul. 10, 2008

(87) PCT Pub. No.: WO2005/041272

PCT Pub. Date: May 6, 2005

(65) Prior Publication Data

US 2008/0258281 A1 Oct. 23, 2008

(30) Foreign Application Priority Data

Oct. 16, 2003 (DE) .......................... 103 48 715

(51) Int. Cl.
*H01L 23/495* (2006.01)
*H01L 21/306* (2006.01)
(52) U.S. Cl. ...................... 438/694; 257/677
(58) Field of Classification Search .......... 257/677, 257/666, 671, 676, E21.294, E21.215; 438/694, 438/703
See application file for complete search history.

(56) References Cited

U.S. PATENT DOCUMENTS

| | | | |
|---|---|---|---|
| 4,883,774 A | | 11/1989 | Djennas et al. |
| 5,554,569 A | * | 9/1996 | Ganesan et al. ............... 29/827 |
| 5,597,760 A | * | 1/1997 | Hirota ........................ 438/397 |
| 5,753,535 A | | 5/1998 | Ebihara |
| 6,117,566 A | | 9/2000 | Matsumoto et al. |
| 6,194,777 B1 | | 2/2001 | Abbott et al. |
| 6,294,100 B1 | | 9/2001 | Fan et al. |
| 6,498,099 B1 | | 12/2002 | McLellan et al. |
| 2001/0008305 A1 | | 7/2001 | McLellan et al. |
| 2002/0048825 A1 | | 4/2002 | Young et al. |
| 2003/0197199 A1 | | 10/2003 | Sakamoto et al. |
| 2004/0183166 A1 | * | 9/2004 | Abbott ........................ 257/666 |

FOREIGN PATENT DOCUMENTS

| | | |
|---|---|---|
| EP | 492952 | 7/1992 |
| EP | 579464 | 1/1994 |
| EP | 335608 | 6/1995 |

(Continued)

*Primary Examiner*—Thomas L Dickey
*Assistant Examiner*—Nikolay Yushin
(74) *Attorney, Agent, or Firm*—Dicke, Billig & Czaja, PLLC (57) ABSTRACT

A semiconductor having a leadframe is disclosed. In one embodiment, a leadframe is disclosed to be fitted with a semiconductor chip and is to be encapsulated with a plastic compound has a metallic single-piece base body, to which an interlayer is applied. The interlayer has a surface including a matrix of islands of remaining material of substantially uniform height, with voids extending between said islands.

26 Claims, 4 Drawing Sheets

FOREIGN PATENT DOCUMENTS

| | | |
|---|---|---|
| JP | 56050551 | 5/1981 |
| JP | 57099763 | 6/1982 |
| JP | 61201797 | 9/1986 |
| JP | 62089891 | 4/1987 |
| JP | 62093039 | 4/1987 |
| JP | 4036478 | 2/1992 |
| JP | 4284650 | 10/1992 |
| JP | 8264957 | 10/1996 |
| WO | 0042405 | 7/2000 |

* cited by examiner

PROCESS FOR PRODUCING AND APPARATUS FOR IMPROVING THE BONDING BETWEEN A PLASTIC AND A METAL

CROSS REFERENCE TO RELATED APPLICATION

This Utility Patent Application claims the benefit of the filing date of German Application No. DE 103 48 715.8, Oct. 16, 2003, and International Application No. PCT/DE2004/002199, filed Oct. 1, 2004, both of which are herein incorporated by reference.

FIELD OF INVENTION

The invention relates to a semiconductor having a leadframe or its base body for a semiconductor device, and a method of producing the semiconductor.

BACKGROUND

A leadframe of this type is known from U.S. Pat. No. 5,554,569. This document describes a process for mechanically roughening the surface of a leadframe by bombardment with abrasive, microscopically small particles which include, inter alia, sand, silicon dioxide or aluminum dioxide.

The leadframe described in U.S. Pat. No. 5,554,569 can scarcely be produced economically, since a dry process has to be carried out in addition to the wet-chemical processes used to clean and improve the leadframe surface in a closed production line with baths arranged spatially in succession. Moreover, a cleaning step has to be provided for in order to remove the residues of blasting agents from the leadframe surface.

U.S. Pat. No. 5,554,569 also reports on bonding agents for improving the bonding between leadframe and plastic encapsulation. Moreover, it states that it is known that the bonding between leadframe and plastic can be improved by the targeted application of copper oxides to the leadframe. However, the abovementioned processes all have the drawback of being difficult to carry out.

Moreover, damage and unreliability still occur in operation with all of the semiconductor devices produced using the processes known from the prior art.

For these and other reasons there is a need for the present invention.

SUMMARY

The present invention provides a semiconductor device which can always be operated reliably.

In one embodiment, the invention provides a leadframe or its base body having a roughened, three-dimensional surface, which offers greatly improved bonding for the encapsulating plastic in the semiconductor device. The production process according to the invention can easily and economically be integrated in the existing manufacturing sequence used to clean and improve the leadframe.

The leadframe, after stamping, is subjected to various wet-chemical and/or electrodeposition processes, such as degreasing, pickling and/or the application of various layers.

Following these conventional manufacturing processes according to the invention, a further interlayer is applied by a wet-chemical route, this further interlayer including nickel and/or silver and/or a silver-containing alloy or compound. Second, once again by a wet-chemical route, the surface of the applied interlayer is etched into in such a way that the interlayer acquires a three-dimensional surface structure. The leadframe is cleaned in order to remove all impurities which have collected on the surface.

The advantage of this process for producing the leadframe according to the invention with improved bonding is that on account of the type of processes involved it is possible without major outlay to introduce the required manufacturing steps into an existing production line used to clean and improve leadframes. The application and etching of the interlayer according to the invention are carried out in separate baths, while existing tanks can be used for the final cleaning step.

A further advantage for leadframes which are produced and processed in the form of endless strips compared to the prior art is that it is easy for additional baths to be integrated in the production line, which is being adapted to the endless form. By contrast, the introduction of a chamber for the blasting process into an endless line entails major technical problems in particular on account of the sealing which is required at the entry to the chamber and the exit from the chamber.

The advantage of the leadframe according to the invention compared to leadframes whose surface has been treated with bonding agents lies in the much lower production costs.

The advantage over a leadframe whose surface has been treated by means of blasting, in addition to the lower costs on account of simplified production, is also that the leadframe according to the invention, in accordance with the quality of the final cleaning step, is free of disruptive particles, which can cause the failure of a device.

As has already been mentioned, a particularly economical way of applying the silver required for the interlayer is deposition from an aqueous bath by means of conventional chemical deposition or electrodeposition processes, since such processes are easy to integrate in the existing manufacturing line used to clean and improve the leadframe.

The same applies to interlayers which include a silver alloy and/or silver compound and/or nickel. In this case too, wet-chemical deposition processes are advantageous.

The interlayer may in this case be applied as a single layer which serves only to produce a three-dimensional surface structure.

However, it is also possible and conceivable for a layer which comprises a plurality of individual layers to be applied instead of one homogeneous interlayer. This is desirable in particular if the interlayer, in addition to providing the three-dimensional surface structure, is also to perform further tasks. One conceivable use example in this respect is the application of an additional individual layer to a leadframe which includes copper or an iron-nickel alloy, or Alloy 42, for eutectic devices, in which this additional individual layer acts as a mechanical buffer for compensating for stresses which occur during attachment of the semiconductor chip.

It is also conceivable and possible for the various individual layers either to have different chemical compositions or to have the same composition but then to be deposited in different processes and therefore to have different mechanical properties.

The application of the interlayer is followed, as a further process, by a treatment of the surface in order to obtain the three-dimensional structure required to improve the bonding. It would be possible for this three-dimensional structure to be formed by the targeted formation of dendrites at the surface. However, for economic reasons and for simplicity of process control it is also advantageous to form a three-dimensional structure by etching into the surface of the interlayer, i.e., by the controlled production of voids in the surface.

Moreover, it is conceivable and possible for this three-dimensional structure to be produced by coarse deposition or by relatively coarse regions or structures of nickel and/or silver and/or a silver alloy with a subsequent etch.

Two different etching methods, which may have different advantages depending on the composition of the interlayer, are recommended for etching into the surface.

Firstly, it is possible to produce voids by a grain boundary etch. This process is advantageous if the interlayer is a pure silver layer.

If the interlayer is a silver compound and/or nickel and/or a silver alloy, such as for example a silver-zinc alloy containing approx. 2% to approx. 5% zinc, it is advantageous for the compound component or the alloying component to be etched out in order to form the voids.

A simple way of implementing the process according to the invention for producing a leadframe with an interlayer in accordance with the invention, which is advantageous therefore in particular for economic reasons, provides for a uniform treatment of the entire surface of the leadframe in accordance with the present invention.

However, depending on the type of leadframe and/or of the finished device, it may also be advantageous for only certain regions of the leadframe to be treated in accordance with the present invention, i.e., for the three-dimensional surface structure to be applied only to certain locations. One conceivable application is devices for the field of automotive engineering, in which a critical point is the penetration of moisture via extremely small gaps between leadframe and plastic. The size of these gaps can be reduced by the application of a frame with a surface structure which improves bonding according to the present invention around the semiconductor chip.

The nature of the leadframe and/or of the finished device also determines the chemical composition of the interlayer. Depending on, for example, the required electrical and thermal conductivity, the hardness and/or other desired mechanical properties, either a pure silver layer and/or a silver alloy and/or a silver compound and/or nickel may be advantageous.

To improve the bonding of plastics which are customarily used on the surface of the leadframe, it is advantageous if the surface of the interlayer according to the invention has a geometry as described below. The typical roughness average $R_a$ or waviness and/or surface roughness average $S_a$ is between approx. 0.1 µm and approx. 0.9 µm, preferably between approx. 0.1 µm and approx. 0.5 µm. The matrix of islands of remaining material typically has a mean width of approx. 0.5 µm, and the voids located therein typically have a width of approx. 2 µm.

The geometry of the surface of the interlayer according to the invention can also be described by the ratio of islands to voids. Evaluation of a typical surface according to the present invention provides the following results: the ratio of the surface areas of islands to voids is typically in the range between approx. 2:1 and approx. 1:2.

Further embodiments, which will not be dealt with in more detail here, include interlayers with different compositions than those which have been mentioned thus far. Within the context of the present invention, it is appropriate to use all materials which, according to the present invention, can be etched into at their surface to produce a three-dimensional structure. In particular materials which produce interlayers which can be used for conventional chip attachment processes and conventional contact-connection processes are particularly advantageous.

Moreover, it is conceivable and possible for the interlayer according to the invention to be applied not by means of wet-chemical methods, but rather by chemical or physical vapor deposition processes, i.e., CVD or PVD. An embodiment of this type is advantageous if extremely high demands are imposed on the purity of the resulting interlayer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The semiconductor device according to the invention is described below on the basis of exemplary embodiments corresponding to the drawing, in which.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
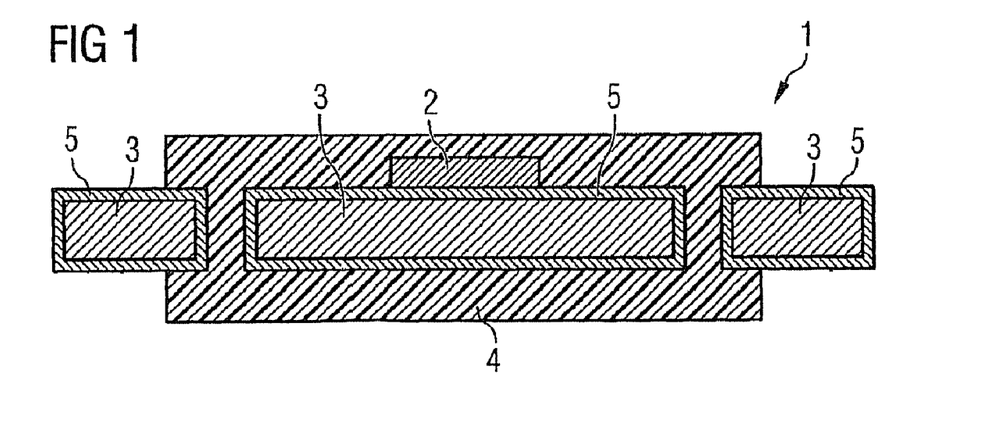
FIG. 1 illustrates a cross section through a semiconductor device according to the invention.

FIG. 1 illustrates a greatly enlarged cross section through one embodiment of a semiconductor device 1. The drawing is not to scale; the size ratios are illustrated on a distorted scale for the purpose of illustrating the schematic structure.

In addition to a semiconductor chip 2, the semiconductor device 1 has a base body 3 with interlayer 5 according to the invention. Semiconductor chip 2 and base body 3 are surrounded by a plastic compound 4.

The contact-connection of the semiconductor chip is not illustrated for the purpose of simplicity and since it is of no importance to the present invention.

Figure 2:
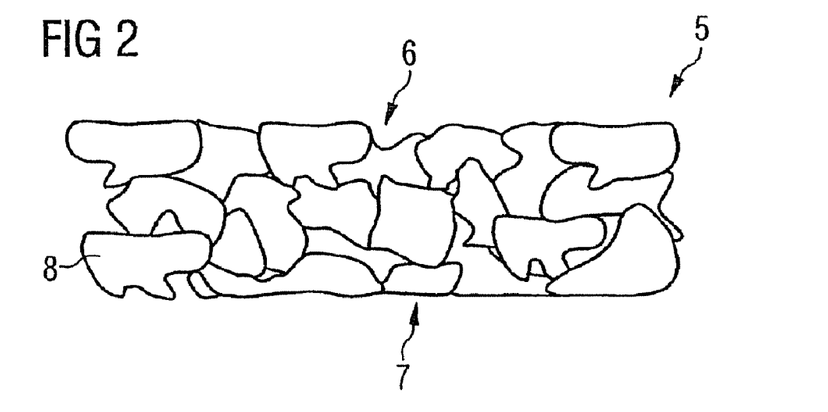
FIG. 2 illustrates the schematic structure of an interlayer in accordance with a first embodiment of the invention.

FIG. 2 illustrates a greatly enlarged view, not to scale, of the schematic structure of the interlayer 5 according to the invention before the etching process is carried out. According to a first embodiment, this interlayer 5 includes silver. The individual silver grains 8 which form a continuous surface 6 without voids 10 are illustrated in the figure. The underside 7 of the interlayer 5 is connected to the outer side of the leadframe (not shown here).

Figure 3:
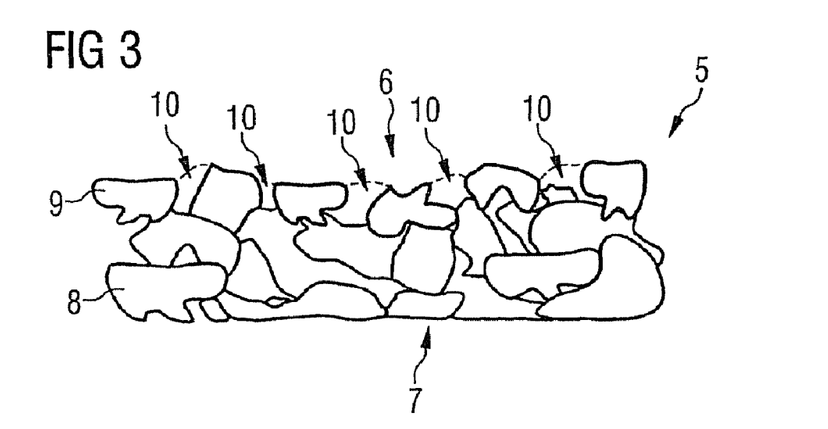
FIG. 3 illustrates the schematic structure of the interlayer according to the invention from FIG. 2 after an etching process has been carried out.

FIG. 3 illustrates a greatly enlarged view, not to scale, of the schematic structure of the interlayer 5 according to the invention after the etching process has been carried out. As in FIG. 1, according to a first embodiment this interlayer 5 includes silver. The underside 7 of the interlayer 5 is identical to that shown in FIG. 1. However, the surface 6 now has voids 10 which have formed between the relatively small grains 9 of the surface 6 which has been etched into.

Figure 4:
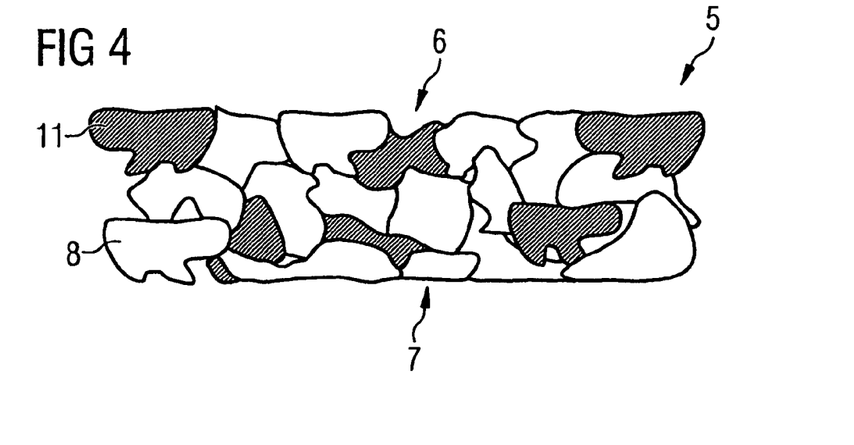
FIG. 4 illustrates the schematic structure of a further interlayer according to the invention.

FIG. 4 illustrates a greatly enlarged view, not to scale, of the schematic structure of the interlayer 5 according to an alternative embodiment of the invention before the etching process is carried out. In accordance with this embodiment, this interlayer 5 includes a silver alloy. Therefore, in addition to the silver grains 8, FIG. 4 also shows grains 11 which include the further alloying components. The interlayer 5 likewise has a surface 6 without voids 10, but in this embodiment the surface is composed of silver grains 8 and grains of the alloying component 11. The interlayer 5 of this embodiment is connected to the outer side of the leadframe (not shown here) via the underside 7 once again.

Figure 5:
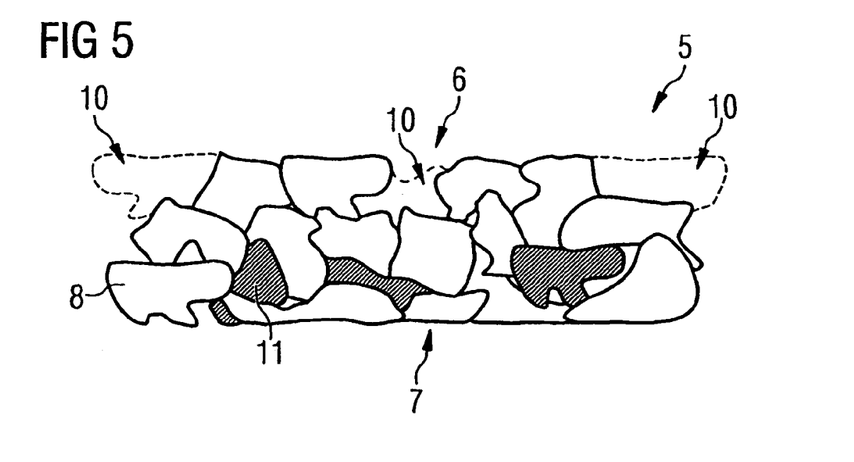
FIG. 5 illustrates the schematic structure of the interlayer according to the invention from FIG. 4 after an etching process has been carried out.

FIG. 5 illustrates a greatly enlarged view, not to scale, of the schematic structure of the interlayer 5 in accordance with an alternative embodiment of the invention after the etching process has been carried out. As in FIG. 3, according to this alternative embodiment, the interlayer 5 includes a silver alloy, i.e., grains of the alloying component 11 are present in addition to the silver grains 8. The underside 7 of the interlayer 5 is once again identical to that shown in FIG. 3. The surface 6 has voids 10 which, unlike in FIG. 2, have been formed by removing the grains of the alloying component 11 between the remaining silver grains 8. The remaining silver grains 8 are of unchanged size.

Figure 6:
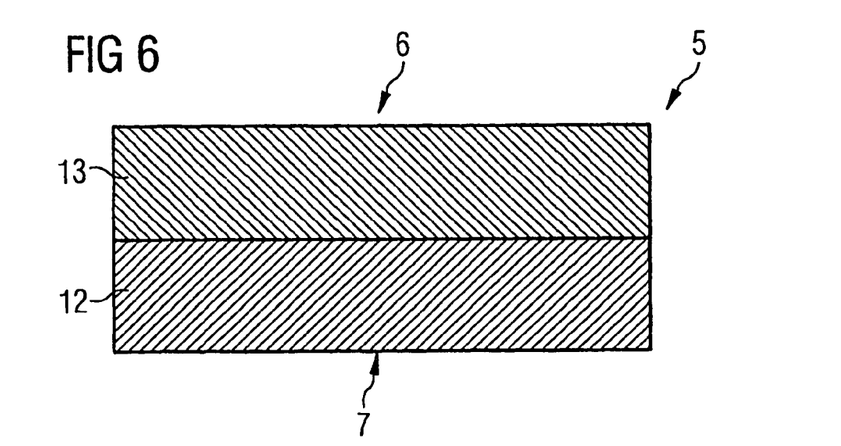
FIG. 6 illustrates the schematic structure of an interlayer in accordance with a further embodiment of the invention.

FIG. 6 illustrates a greatly enlarged view, not to scale, of the schematic structure of the interlayer 5 according to a further embodiment of the invention, once again before the etching process is carried out. According to this embodiment, the interlayer 5 includes two individual layers of different compositions; in the exemplary embodiment shown here, the lower individual layer 12 includes silver, while the upper individual layer 13 is formed from a silver alloy. According to this exemplary embodiment, the interlayer 5 is connected to the outer side of the leadframe (not shown here) via the underside 7 of the lower individual layer 12. The structure of the upper individual layer 13 of this interlayer 5 corresponds to the structure shown in FIG. 3, except that the underside of the upper individual layer 13 is not in direct contact with the leadframe, but rather represents the interface with the lower individual layer 12.

Figure 7:
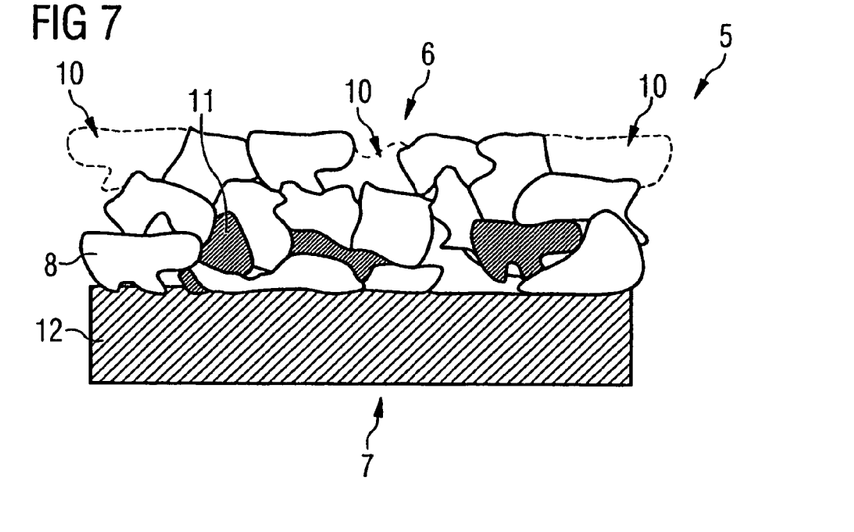
FIG. 7 illustrates the schematic structure of the interlayer according to the invention from FIG. 6 after an etching process has been carried out.

FIG. 7 illustrates a greatly enlarged view, not to scale, of the schematic structure of the interlayer 5 in accordance with a further embodiment of the invention after the etching process has been carried out. The surface structure formed in this embodiment is of similar type to that shown in FIG. 5, i.e., it includes voids 10 which are formed by the removal of grains of the alloying component 11, while leaving behind the silver grains 8 of unchanged size.

Figure 8:
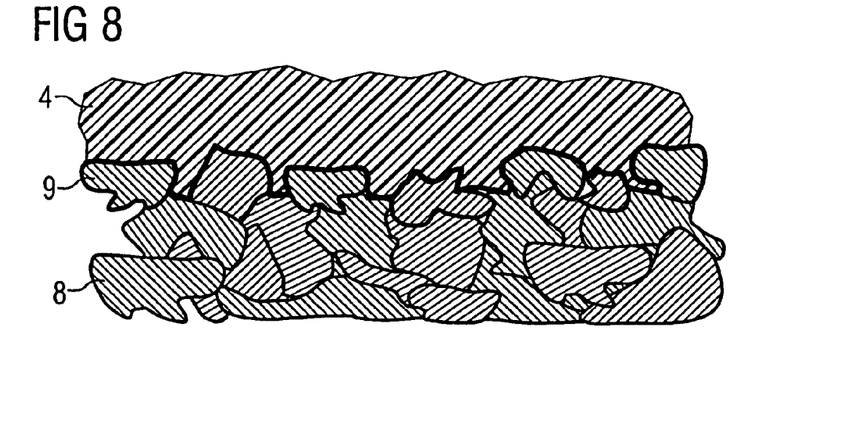
FIG. 8 illustrates the schematic structure of the transition between interlayer according to the invention and plastic in accordance with the first exemplary embodiment.
Figure 9:
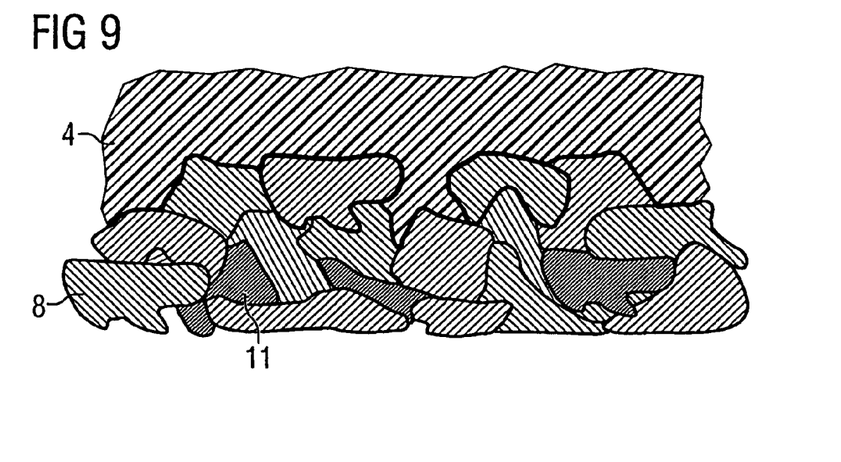
FIG. 9 illustrates the schematic structure of the transition between interlayer according to the invention and plastic in accordance with the exemplary embodiments from FIGS. 5 and 7.

FIG. 8 and FIG. 9 illustrate a greatly enlarged view, not to scale, of the schematic structure of the interlayer 5 according to the invention after the etching process has been carried out and after the application of the plastic 4 corresponding to the semiconductor device 1. The plastic 4 has penetrated into the voids illustrated in FIGS. 3, 5 and 7.

Figure 10:
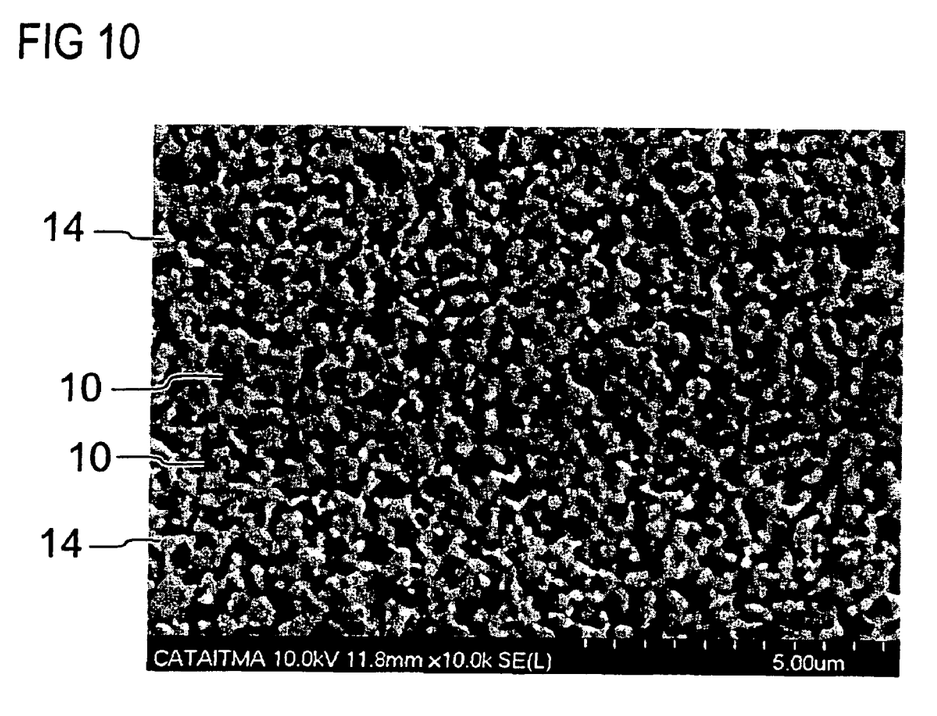
FIG. 10 illustrates a scanning electron microscope image of the surface of the interlayer according to the invention after the etching process has been carried out.

FIG. 10 illustrates a scanning electron microscope image of the three-dimensional structure of the surface 6 of the interlayer 5 in accordance with the first embodiment. The islands 14 of the remaining material with a typical mean diameter of approx. 0.5 µm can be recognized as light regions, surrounded by dark voids 10 with a typical mean void width of approx. 2 µm.

According to the present invention, a feature common to all the embodiments is that the etching process according to the invention modifies the surface 6 of an interlayer 5 which has been applied to the base body 3 for this purpose in such a way that voids 10 are formed in the surface 6 of the interlayer 5, as diagrammatically depicted in FIGS. 3, 5 and 7. These voids 10, on account of their size and geometry, allow the plastic 4 of the semiconductor device 1 to be mechanically anchored on or interlocked with the surface 6 of the interlayer 5, as diagrammatically depicted in FIGS. 8 and 9.

FIG. 6 and FIG. 7 illustrate a two-layer structure of the interlayer 5. The upper individual layer 13 of the interlayer 5 is etched into in accordance with the invention in order to produce the three-dimensional structure for anchoring or interlocking the plastic 4 on the interlayer 5.

The lower individual layer 12 is applied in order to impart additional properties, such as for example a defined elasticity, to the interlayer 5. The upper individual layer 13 and lower individual layer 12 may, but need not, have different chemical compositions. It is conceivable and possible for both individual layers to have the same chemical composition but to be deposited in different process steps and therefore to have different mechanical properties.

FIG. 7 illustrates an embodiment having an upper individual layer 13 which includes a silver alloy. The lower individual layer 12 is not specified in more detail, and therefore may, for example, include nickel and/or silver and/or a silver alloy.

The scanning electron microscope image in FIG. 10 illustrates the three-dimensional structure of the surface 6 of the interlayer 5, which by virtue of the voids 10 creates spaces for the anchoring or interlocking of the plastic 4 on this surface 6.

The following procedure is adopted to produce the interlayer according to the invention as illustrated in FIG. 3.

To produce the interlayer according to the invention, the grain boundaries of the interlayer 5 which includes silver and had been applied to a nickel-plated leadframe, were etched into by means of sulfuric acid ($H_2SO_4$) in accordance with the parameters listed in Table 1. For this purpose, the sulfuric acid comprising approx. 96% strength sulfuric acid ($H_2SO_4$) was produced by dilution with water in accordance with the values indicated in Table 1.

TABLE 1

Etching of grain boundaries of a silver interlayer

| Parameter | Value approx. |
| --- | --- |
| Current density | 2 A/dm$^2$ |
| Time | 16 sec |
| Temperature | 55° C. |
| Dilution of the approx. 96% strength sulfuric acid with water | 140 ml/L |

By means of these etching parameters, the three-dimensional structure illustrated in FIG. 10 was produced on the surface 6 of the silver-containing interlayer 5, the characteristic geometric variables of which surface are compiled in Table 2.

TABLE 2

Typical characteristic geometric variables of the etched surface

| Characteristic variable | Value approx. |
| --- | --- |
| Grain size of the silver (after etching) | ~0.5 μm |
| Width of the voids | ~2 μm |
| Roughness average $R_a$ or $S_a$ | 0.1-0.5 μm |

The roughness average $R_a$ is defined as the arithmetic mean of the absolute profile deviation within the total measurement distance, equating to the height of a rectangle having the same surfaces as the surfaces between the profile centerline and the actual profile.

Further tests were carried out in order to determine the entire range of parameters within which etching into the silver grains 8 leads to the formation of the interlayer 5 according to the invention with a surface geometry corresponding to the characteristic variables given in Table 2. The results of these tests are compiled in Table 3.

TABLE 3

Range of possible etching parameters

| Parameter | Value approx. |
| --- | --- |
| Current density | 0.5-4 A/dm$^2$ |
| Time | 4-40 sec |
| Temperature | 25-60° C. |
| Dilution of the approx. 96% strength sulfuric acid with water | 100-200 ml/L |

A further result of these tests in accordance with the present invention was the range of possible roughness averages, i.e. the roughness averages for which the desired interlocking or anchoring of the plastic 4 at the surface 6 of the interlayer 5 is possible. According to these tests, the roughness averages $R_a$ are typically between 0.1 and 0.9 μm.

According to the present invention, as per the example shown here, it is possible to find a range of parameters for etching out the alloying components in the interlayer 5 which includes nickel and/or a silver alloy and/or a silver compound.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A process for producing a leadframe configured to be fitted with a semiconductor chip and to be encapsulated with a plastic compound, the process comprising:
   providing a leadframe base body;
   applying an interlayer attackable by an etchant that comprises one or more individual layers, to the leadframe; and
   etching into the surface of the interlayer using the etchant to form a matrix of islands of remaining material of substantially uniform height with voids extending between these islands.

2. The process as claimed in claim 1, comprising depositing silver, a silver alloy and/or a silver compound and/or nickel for the interlayer by means of chemical or electrodeposition processes.

3. The process as claimed in claim 1, comprising applying silver, a silver alloy and/or a silver compound and/or nickel as a coarse deposit for the interlayer.

4. The process as claimed in claim 1, comprising applying the interlayer in the form of one or more individual layers each having a uniform composition.

5. The process as claimed in claim 1, comprising wherein the etching is effected as grain boundary etching at the surface of the interlayer and/or is carried out by selectively etching out at least one of the alloying constituents or the compound components of the silver at the surface of the interlayer.

6. The process as claimed in claim 1, comprising wherein the application of the interlayer and the etching are both carried out over the entire surface of the leadframe base body.

7. The process as claimed in claim 1, comprising wherein both the application of the interlayer and the etching are carried out selectively at defined locations of the surface of the leadframe base body.

8. The process as claimed in claim 1, wherein etching into the surface of the interlayer using the etchant includes etching such that the surface of the interlayer has a roughness average Ra of between approximately 0.1 μm and 0.9 μm.

9. A process for producing a semiconductor device, comprising:
   producing a leadframe base body including, providing the leadframe, applying an interlayer attackable by an etchant that comprises one or more individual layers, to the leadframe base body, and etching into the surface of the interlayer using the etchant to form a matrix of islands of remaining material of substantially uniform height with voids extending between these islands;
   placing a semiconductor chip onto the leadframe base body; and
   applying a plastic compound as encapsulating housing to the leadframe base body and semiconductor chip.

10. The process as claimed in claim 9, comprising depositing silver, a silver alloy and/or a silver compound and/or nickel for the interlayer by means of chemical or electrodeposition processes.

11. The process as claimed in claim 9, comprising applying silver, a silver alloy and/or a silver compound and/or nickel as a coarse deposit for the interlayer.

12. The process as claimed in claim 9, comprising applying the interlayer in the form of one or more individual layers each having a uniform composition.

13. The process as claimed in claim 12, comprising wherein the etching is effected as grain boundary etching at the surface of the interlayer and/or is carried out by selectively etching out at least one of the alloying constituents or the compound components of the silver at the surface of the interlayer.

14. The process as claimed in claim 13, comprising wherein the application of the interlayer and the etching are both carried out over the entire surface of the leadframe base body; and
wherein both the application of the interlayer and the etching are carried out selectively at defined locations of the surface of the leadframe base body.

15. A semiconductor device including a semiconductor chip and to be encapsulated with a plastic compound, the semiconductor device comprising:
a metallic single-piece base body of a leadframe,
at least one interlayer which has been applied to the base body and may comprise one or more individual layers, and
the interlayer having a surface comprising a matrix of islands of remaining material of substantially uniform height with voids extending between these islands.

16. The semiconductor device as claimed in claim 15, wherein in that the interlayer comprises silver, a silver alloy and/or a silver compound and/or nickel.

17. The semiconductor device as claimed in claim 15, comprising wherein the surface of the interlayer has a roughness average Ra of between approx. 0.1 µm and approx. 0.9 µm.

18. The semiconductor device as claimed in claim 15, comprising wherein the remaining islands at the surface of the interlayer typically have a mean diameter of approx. 0.5 µm.

19. The semiconductor device as claimed in claim 15, comprising wherein the voids at the surface of the interlayer typically have a mean width of approx. 2 µm.

20. The semiconductor device as claimed in claim 15, comprising wherein the surface of the interlayer typically has a ratio of the surface areas of islands to voids in the range from approx. 2:1 to approx. 1:2.

21. A semiconductor device comprising:
a semiconductor chip and having an encapsulation of plastic compound;
a metallic single-piece base body of a leadframe, and at least one interlayer which has been applied to the base body and may comprise one or more individual layers, and
the interlayer having a surface comprising a matrix of islands of remaining material of substantially uniform height with voids extending between these islands.

22. The semiconductor device as claimed in claim 21, comprising wherein the interlayer comprises silver, a silver alloy and/or a silver compound and/or nickel.

23. The semiconductor device as claimed in claim 21, comprising wherein the surface of the interlayer has a roughness average Ra of between approx. 0.1 µm and approx. 0.9 µm.

24. The semiconductor device as claimed in claim 23, comprising wherein the remaining islands at the surface of the interlayer typically have a mean diameter of approx. 0.5 µm.

25. The semiconductor device as claimed in claim 24, comprising wherein the voids at the surface of the interlayer typically have a mean width of approx. 2 µm.

26. The semiconductor device as claimed in claim 25, comprising wherein the surface of the interlayer typically has a ratio of the surface areas of islands to voids in the range from approx. 2:1 to approx. 1:2.

* * * * *